United States Patent [19]

Washisu

[11] Patent Number: 4,717,979
[45] Date of Patent: Jan. 5, 1988

[54] MAGNETIC SENSOR DEVICE

[75] Inventor: Koichi Washisu, Tokyo, Japan

[73] Assignee: Canon Kabushiki Kaisha, Tokyo, Japan

[21] Appl. No.: 790,042

[22] Filed: Oct. 22, 1985

[30] Foreign Application Priority Data

Oct. 24, 1984 [JP] Japan ................... 59-224837

[51] Int. Cl.⁴ .............. G11B 5/27; G11B 5/33; G11B 5/265; G01R 33/02
[52] U.S. Cl. ................... 360/113; 324/207; 338/32 R; 360/121
[58] Field of Search ............... 360/113, 121; 324/207–208, 252, 244, 225; 338/32 R

[56] References Cited

U.S. PATENT DOCUMENTS 4,523,243 6/1985 Billington .............. 360/113
4,673,998 6/1987 Souda .................. 360/113

Primary Examiner—A. J. Heinz
Attorney, Agent, or Firm—Toren, McGeady & Associates

[57] ABSTRACT

A magnetic sensor device in which a plurality of magnetic resistive effect type elements for reading signals of respective reading channels recorded on a magnetic medium are biased by different magnetic fields from each other.

8 Claims, 13 Drawing Figures

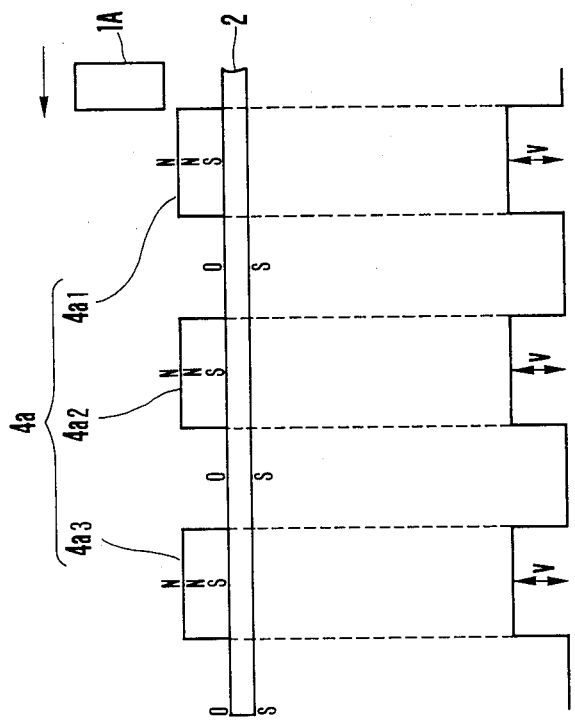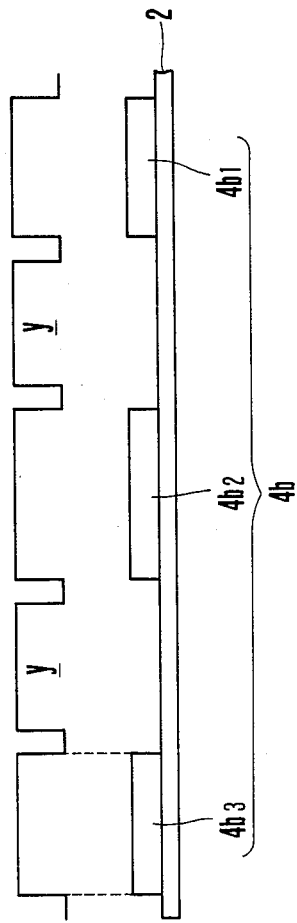
FIG.3
FIG.4A
FIG.4B

MAGNETIC SENSOR DEVICE

BACKGROUND OF THE INVENTION

1. Field of the Invention

This invention relates to magnetic sensor devices using magnetic resistive effect type elements, and more particularly, to magnetic sensor devices for reproducing signals such as those representing position codes recorded on a medium whose reading channel code is plural, or at so-called multi-tracks.

2. Description of the Prior Art

The magnetic sensor devices for use in reading code signals, such as those representing positions recorded on magnetic recording media by using a plurality of elements having the magnetic resistive effect (hereinafter referred to as the "magnetic resistive effect type" element) arranged in a row on a substrate, are known as the position detector or the like. In this kind of device, the code signals are read out electrically in the form of a change of resistance of that element for the purpose of detecting the absolute position of an object bearing the magnetic recording medium.

FIG. 1A illustrates an example of the prior known magnetic sensor device wherein the device is generally indicated at 1, operating with a magnetic recording medium 2 having a multiple channel to record signals in Gray Code form, 4a and 4b representing the least and most significant bit code signals, respectively.

Four magnetic resistive effect elements 1A to 1D are buried at the bottom of a substrate 10 and are arranged to face at respective channels. Each of the elements 1A to 1D has output lines on either side thereof. A bias line 5 is provided on the substrate 10 and its arrangement is such that all the elements 1A to 1D are biased by an equal magnetic field to each other.

In such a prior known device, on assumption that the code signals 4a ... 4b on the magnetic recording medium 2 takes the magnetized form in a direction parallel to the thickness of the medium 2 with the N and S poles being farther and nearer from and to the base of the medium 2 as shown in FIG. 1B, it may be considered that a neighboring point P1 to the code signal on the recording medium 2 is magnetized to S pole.

In FIG. 1B, the code signal 4a having magnetic recorded elements 4a1, 4a2, ... is scanned when the magnetic resistive effect (MR) element 1A moves past successive points P1 to P6.

P1 is an intermediate point between the recorded elements 4a1 and 4a2.

P2 is a point at the initial end of the recorded element 4a2.

P3 is a point the MR element 1A arrives at after having advanced ¼ from the initial end of the recorded element 4a2.

P4 is a point when the MR element 1A has come to the center of the longitudinal length of the recorded element 4a2.

P5 is a point when the MR element 1A has advanced ¾ on the recorded element 4a2.

P6 is a point when the MR element 1A has come to the terminal end of the recorded element 4a2.

Plotting the values of voltage at the output of the aforesaid MR element 1A against the individual points P1 to P6 in position and smoothly connecting these plotted points, we obtain a curve shown in FIG. 2A. By subjecting the output signal of the magnetic sensor device 1 to inversion when in signal processing, the curve of FIG. 2A is changed to a one shown in FIG. 2B.

Here, the waveform of FIG. 2B can be related to the magnetic recorded elements the MR element 1A has scanned as shown in FIG. 2C. A portion "y" of the waveform of FIG. 2B represents an output signal which occurs when no magnetic recorded element is scanned, so to speak, an unnecessary signal. This "y" signal, when it actually comes out in the output of the MR element, gives an influence on the accuracy of detection of the position by the MR element.

The method of removing this unnecessary "y" signal is to apply a magnetic field as the bias to the MR element. For this purpose, as shown in FIG. 1A, the MR elements for scanning the magnetic recorded elements are provided with a bias line 5 to give them a bias magnetic field. When the MR elements are biased to S pole of magnetic field, the S pole between the successive two recorded elements on the medium 2 is cancelled so that it can no longer be detected as a component of the output of the MR element.

From the foregoing reason, the magnetic sensor device has means for generating a bias magnetic field as shown in FIG. 1A. In case when the signals to be read are spread over a plurality of tracks, or are of the multi-track type, the use of a uniform intensity distribution of bias magnetic field over all the MR elements gives rise to a problem. That is, a bias which is proper to the signal 4a of the least significant bit in FIG. 1A for enabling to erase the signal components appearing between the recorded elements (FIG. 4A) becomes improper for the signal 4b of the most significant bit. This is because the size of the area of the magnetic recorded element for the signal of most significant bit 4b is larger, and its magnitude of magnetic field acting on the MR element 1D is larger than that of magnetic field of the signal 4a of least significant bit on the MR element 1A, and, therefore, because the S-polarized magnetic field between the successive two magnetic recorded elements for the signal 4b of the most significant bit is also larger. For this reason, the magnitude of magnetic field of the bias that is optimum to the signal 4a of least significant bit cannot cancel all of the S-polarized magnetic field at an intermediate point between the magnetic recorded elements for the signal 4b of the most significant bit. As a result, the output of the MR element for the signal 4b of the most significant bit includes a spurious signal "y" arising from between the recorded elements.

SUMMARY OF THE INVENTION

It is an object of the present invention to provide a magnetic sensor device in which when magnetically recorded signals to be read by using the magnetic resistive effect type element are on a plurality of channels, an improvement of the accuracy of signal reading in each channel is achieved.

BRIEF DESCRIPTION OF THE DRAWINGS

FIG. 3 is a schematic diagram of the bias of magnetic field for erasing the unnecessary signal.

FIG. 4A is a waveform of the output of the MR element for the signal of least significant bit after the unnecessary signal has been removed.

FIG. 4B is waveforms of the signal of the most significant bit.

DETAILED DESCRIPTION OF THE PREFERRED EMBODIMENTS

Figure 1A:
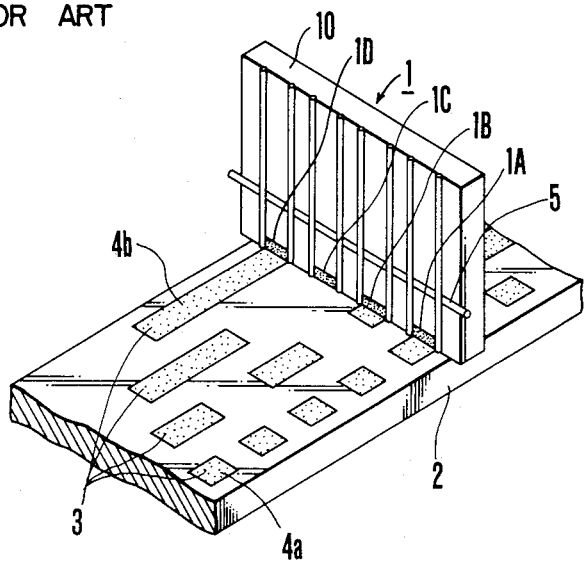
FIG. 1A is a perspective view of the arrangement of the prior known magnetic sensor device.
Figure 1B:
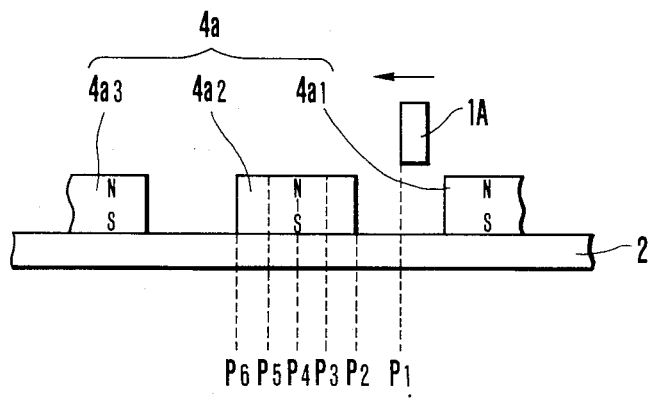
FIG. 1B is a schematic diagram illlustrating the relationship between the positions of the MR element and the magnetic recorded element.
Figures 2A, 2B, 2C:
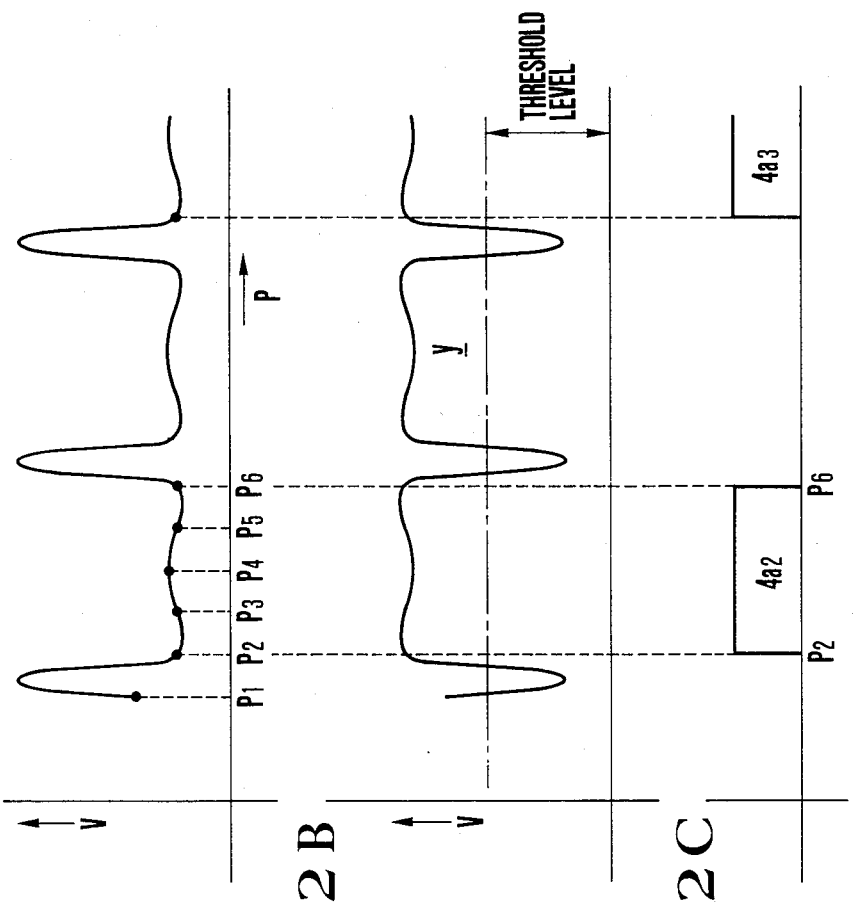
FIGS. 2A and 2B are graphs of variations of the output of the MR element as it scans past the points P1 to P6 of FIG. 1B.
FIG. 2C is a chart of what portion of the waveform of FIG. 2B corresponds to the magnetic recorded element.
Figure 5:
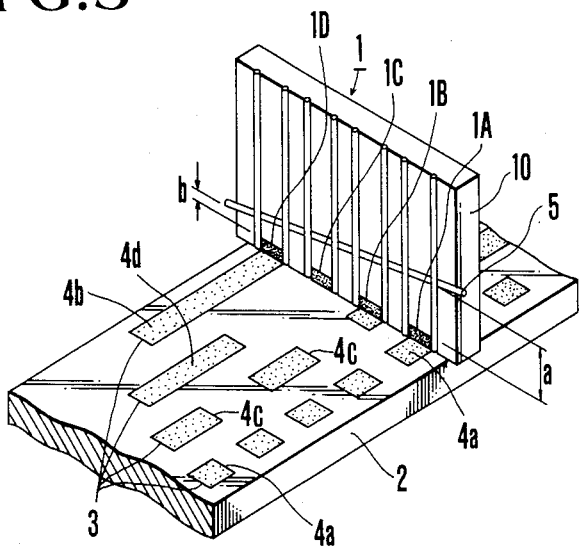
FIG. 5 is a perspective view of a first embodiment of a magnetic sensor device according to the present invention.

In FIG. 5 there is shown a first embodiment of the invention wherein the same reference numerals have been employed to denote the similar parts to those shown in FIG. 1. These similar parts are not further explained below. A bias line 5 is formed at an inclination with the row of the MR elements 1A to 1D such that the relationship between the distance, a, from the first MR element 1A which faces the least significant bit signal 4a of the Gray Code signal 3 magnetically recorded on the magnetic recording medium 2 to the bias line 5, and the distance, b, from the fourth MR element 1D which faces the most significant bit signal 4b to the bias line 5, is determined to be a>b depending on the magnitudes of these bit signals 4a and 4b. Therefore, the first MR element 1A is biased to a weaker magnetic field than that to which the fourth MR element 1D is biased to. As a result, each of the four MR elements 1A to 1D is allowed to operate in a dynamic range of variation of the magnetic field, in other words, in that portion of the characteristic curves of the MR element which assures reproduction of each bit signal with high fidelity. Therefore, both of the least and most significant bit signals can be read in good condition. With the bit signals 4a and 4b (also 4c and 4d) reproduced, it is possible to detect the absolute position with high accuracy. It should be noted that even the middle MR elements for the bit signals 4c and 4d are given an optimum bias magnetic field by the bias line 5.

Figure 6:
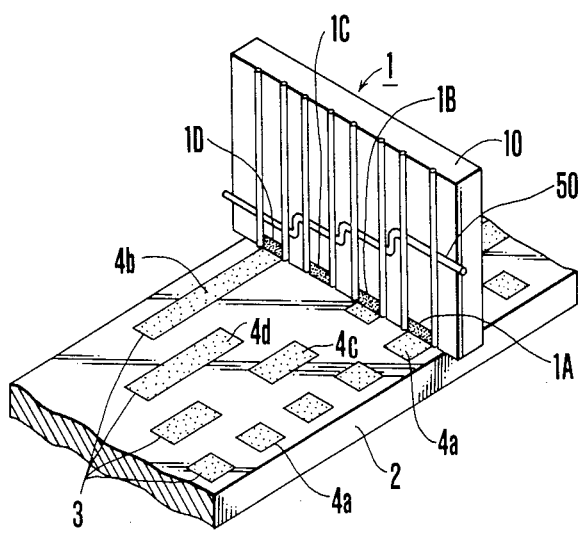
FIG. 6 is a perspective view of a second embodiment of the magnetic sensor device according to the present invention.

FIG. 6 illustrates a second embodiment of the invention wherein the bias line 50 is formed to a stepwise shape relative to the row of the MR elements 1A to 1D, thereby, the MR elements 1A to 1D are biased to respective different magnetic fields from each other. By using such an elaborate form of the bias line, the accuracy of detection of the absolute position can be further improved.

Figure 7:
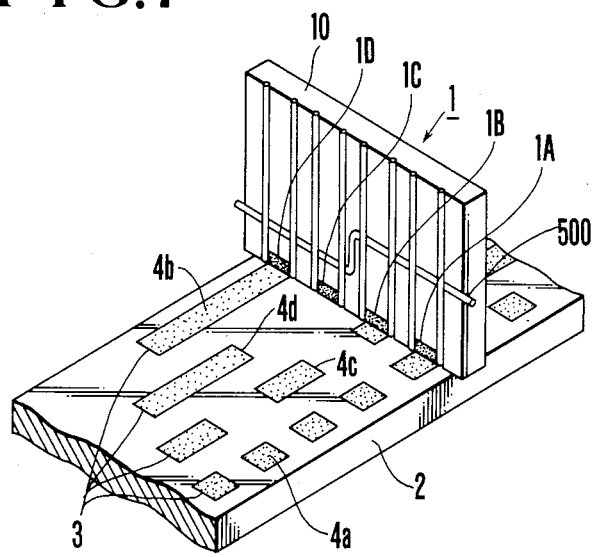
FIG. 7 is a perspective view of a third embodiment of the magnetic sensor device according to the present invention.

The degree of elaboration may be somewhat reduced as shown in FIG. 7 where the MR elements 1A to 1D are taken as a number of groups, in this instance, two groups with the MR elements 1A and 1B in one group and the MR elements 1C and 1D in another, and the distance to the bias line 500 is changed in groups, thereby giving an advantage of making it easy to manufacture the devices, while ignoring the somewhat sacrifice of the fidelity.

Figure 8:
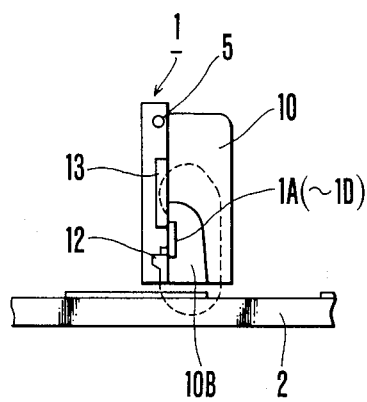
FIG. 8 is a sectional view of a fourth embodiment of the magnetic sensor device according to the present invention.
Figure 9:
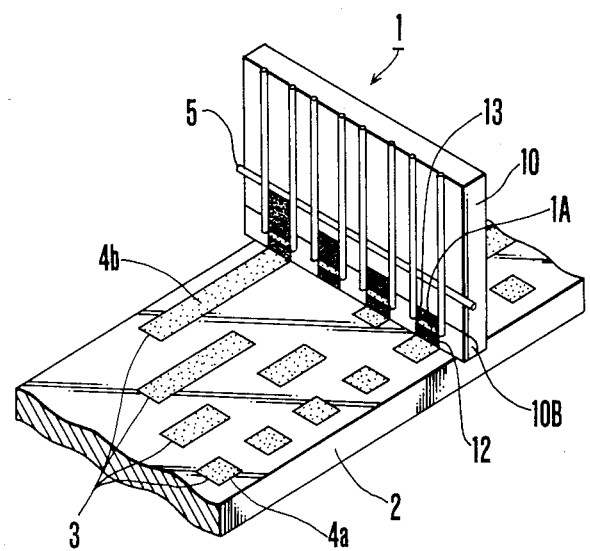
FIG. 9 is a perspective view of the device of FIG. 8.

The present invention is applicable also to such a type of magnetic sensor device as shown in FIG. 8 where the MR elements 1A to 1D are protected by respective members 12 of magnetic material on the near side to the recording medium 2 and respective other members 13 of magnetic material on the far side thereof, the substrate 10 is made of magnetic material, and a closed magnetic circuit is formed by a non-magnetic portion 10B. In order to apply the magnetic bias of different magnitude to different MR elements, instead of changing the form of the bias line, the lengths or widths of the members 13 of magnetic material on the bias line side are made different from one another as shown in FIG. 9.

As has been described above, according to the present invention, the magnetic fields to which the plurality of magnetic resistive effect type elements are made different with different elements or groups of the elements so that due to the conformance to the pattern of the magnetic recorded signals, the signals can be reproduced always with improved fidelity. The use of this output of the magnetic sensor device provides the possibility of detecting and processing signals with high accuracy. Accordingly, the magnetic sensor device of the invention can be more advantageously used for detecting, or controlling the position, or reading the signals than was heretofore possible.

What is claimed is:

1. A magnetic sensor device for reading signals impressed in a plurality of channels on a recording medium comprising a plurality of magnetic resistive effect type elements arranged side by side in alignment with respective reading channels having respectively different magnetic intensities, and means for generating respective bias magnetic fields for each element to give different bias magnetic fields to said different elements.

2. A magnetic sensor device according to claim 1, wherein said bias magnetic field generating means includes an electrically conductive line for generating the bias magnetic field, said line being arranged to vary its distance to said magnetic resistive effect type elements from element to element.

3. A magnetic sensor device according to claim 1, wherein said magnetic resistive effect type elements are divided into a plurality of groups, whereby the magnetic bias is made different from group to group.

4. A magnetic sensor device according to claim 3, wherein said bias magnetic field generating means includes an electrically conductive line for generating the bias magnetic field, said line being arranged to vary its distance to said magnetic resistive effect type elements from group to group.

5. A magnetic sensor drive for reading magnetically recorded information of a magnetic recording medium comprising a plurality of tracks having different intensities of magnetic fields, comprising:
 a plurality of magnetic resistive type elements for detecting magnetically recorded information of each one of said tracks; and
 means for impressing bias magnetic fields with different magnitudes to respective magnetic resistive type elements according to the intensity of the magnetic field of the respective track.

6. A magnetic sensor device according to claim 5, wherein said plurality of tracks of the magnetic recording medium have magnetic recording signals with respectively different areas, whereby said magnetic field intensities of respective tracks are different from each other.

7. A magnetic sensor device according to claim 5, wherein said magnetic resistive effect type elements are divided into a plurality of groups, whereby the magnetic bias is made different from group to group.

8. A magnetic sensor device according to claim 5, wherein said bias magnetic means includes an electrically conductive line for impressing the bias magnetic field, said line being arranged to vary its distance to said magnetic resistive effect type elements from element to element.

* * * * *